(12) United States Patent
Cao

(10) Patent No.: US 12,003,221 B2
(45) Date of Patent: Jun. 4, 2024

(54) DUAL-MODE POWER AMPLIFIER WITH SWITCHABLE WORKING POWER AND MODE SWITCH METHOD

(71) Applicant: Xiumei Cao, Guangdong (CN)

(72) Inventor: Xiumei Cao, Guangdong (CN)

( * ) Notice: Subject to any disclaimer, the term of this patent is extended or adjusted under 35 U.S.C. 154(b) by 466 days.

(21) Appl. No.: 17/311,374

(22) PCT Filed: Mar. 28, 2019

(86) PCT No.: PCT/CN2019/080128
§ 371 (c)(1),
(2) Date: Jun. 7, 2021

(87) PCT Pub. No.: WO2020/113866
PCT Pub. Date: Jun. 11, 2020

(65) Prior Publication Data
US 2022/0029592 A1    Jan. 27, 2022

(30) Foreign Application Priority Data

Dec. 7, 2018   (CN) .......................... 201811494863.3

(51) Int. Cl.
*H03F 1/14*      (2006.01)
*H03F 3/21*      (2006.01)
(Continued)

(52) U.S. Cl.
CPC ............... *H03F 3/211* (2013.01); *H03F 3/72* (2013.01); *H03F 2200/165* (2013.01);
(Continued)

(58) Field of Classification Search
CPC ...... H03F 3/211; H03F 3/72; H03F 2200/165; H03F 2200/318; H03F 2200/534;
(Continued)

(56) References Cited

U.S. PATENT DOCUMENTS

| 8,665,025 B2* | 3/2014 | Cabrera | ................... H03F 3/72 330/273 |
| 10,110,184 B2* | 10/2018 | Lyalin | .................. H03G 11/004 |
| 11,671,061 B2* | 6/2023 | Gebeyehu | .............. H04B 1/401 330/276 |

FOREIGN PATENT DOCUMENTS

| CN | 102124645 A | 7/2011 |
| CN | 203645632 U | 6/2014 |

(Continued)

OTHER PUBLICATIONS

International Search Report of PCT Patent Application No. PCT/CN2019/080128 dated Jun. 28, 2019.

*Primary Examiner* — Khanh V Nguyen

(57) ABSTRACT

The invention discloses a dual-mode power amplifier with switchable working power and a mode switch method. The power amplifier adopts a multi-tap input transformer, and realizes the switching between preload line and output load line by controlling the on/off of the intermediate switch connected with taps, so as to achieve the best power conversion efficiency under different maximum output powers. By using the change-over switch to control the capacitance value of the matching capacitor, it is easier to adjust the load line, thus further ensuring the performance of the power amplifier provided by the invention. The intermediate switch and change-over switch are integrated on an independent chip by CMOS/phemt/bihemt/SeGe/SOI,etc, or on a power amplifier chip by CMOS/phemt/bihemt/SeGe/SOI, etc, which is easy to realize.

10 Claims, 8 Drawing Sheets

(51) Int. Cl.
*H03F 3/26* (2006.01)
*H03F 3/72* (2006.01)

(52) U.S. Cl.
CPC .. *H03F 2200/318* (2013.01); *H03F 2200/534* (2013.01); *H03F 2200/541* (2013.01); *H03F 2203/7221* (2013.01)

(58) Field of Classification Search
CPC ....... H03F 2200/541; H03F 2203/7221; H03F 3/26; H03F 1/0277; H03F 3/20; H03F 1/50; H03F 1/08; H03F 1/565; H03F 3/68; H03F 2200/537; H03F 3/38; H03F 3/195; H03F 3/265; H03H 7/0161; H01F 19/02
USPC .................... 330/51, 154, 165, 188, 195, 27
See application file for complete search history.

(56) References Cited

FOREIGN PATENT DOCUMENTS

| | | |
|---|---|---|
| CN | 107769739 A | 3/2018 |
| CN | 108777490 A | 11/2018 |

\* cited by examiner

DUAL-MODE POWER AMPLIFIER WITH SWITCHABLE WORKING POWER AND MODE SWITCH METHOD

TECHNICAL FIELD

The invention relates to a power amplifier and a mode switch method, in particular to a dual-mode power amplifier with switchable working power and a mode switch method.

BACKGROUND

Power amplifier is a device that can amplify the voltage or power of input signal, which consists of electronic tube or transistor, power transformer and other electrical components. It is widely used in communication, broadcasting, radar, television, automatic control and other devices.

Two main performance indexes of power amplifier are output power and power conversion efficiency. For most commonly used power amplifier categories(A/B/C/D/E/F/$F^{-1}$, etc.), the optimal power conversion efficiency corresponds to the maximum output power, when the output power is lower, its power conversion efficiency will also decrease. Therefore, the conventional single power amplifier is difficult to achieve high power conversion efficiency under different output powers.

Since the maximum output power of power amplifier and its corresponding optimal power conversion efficiency are determined by the load line of the power amplifier, in order to achieve high power conversion efficiency under different output powers, a number of groups of power amplifiers can be integrated in the system. Each group of power amplifiers adopts different load lines and corresponds to different maximum output powers. When the system works, the corresponding power amplifiers can be turned on according to power requirements. The disadvantage of this method is that it requires to integrate two or more groups of power amplifiers in a limited space, which not only increases the manufacturing/material cost, but also is difficult to realize in engineering applications.

SUMMARY

In order to solve the problems existing in the prior art, one of the purposes of the present invention is to provide a dual-mode power amplifier with switchable working power, which can realize switching between preload line and output load line, and further realize maximum output power switching.

In order to achieve the purpose of the present invention, the dual-mode power amplifier with switchable working power provided herein includes:
  an input transformer, comprising a plurality of output taps, and an input coil is loaded with a to-be-amplified signal;
  an output transformer, comprising a plurality of input taps, the number of the input taps is matched with that of the output taps of the input transformer, and an output coil amplified signals;
  an intermediate switch and a power-amplifier transistor, the plurality of output taps of the input transformer are connected with the input taps of the output transformer via the intermediate switch and the power-amplifier transistor, the intermediate switch is configured with a control signal to conduct the power-amplifier transistor connected in series with the intermediate switch, so that one or more of the output taps of the input transformer are communicated with the input taps of the output transformer, and an amplified signal is output after being transformed by the output transformer; and a first matching capacitor and a second matching capacitor, the first matching capacitor and the second matching capacitor are connected in parallel between taps at both ends of the input coil of the output transformer and ground.

Furthermore, a change-over switch is connected between taps at both ends of the input coil of the output transformer and the first matching capacitor.

Furthermore, two or more of the intermediate switches and the change-over switches are a group, integrated on a single SOI chip, or a power amplifier chip.

Furthermore, two or more of the intermediate switches are a group, integrated on a single SOI chip, or a power amplifier chip.

Furthermore, the dual-mode power amplifier with switchable working power further includes an input matching circuit and a preamplifier, wherein the to-be-amplified signal loaded on the input coil of the input transformer is matched by the input matching circuit and amplified by the preamplifier and then loaded.

Furthermore, the input matching circuit includes an input filter circuit.

Furthermore, the dual-mode power amplifier with switchable working power also includes an output matching circuit, wherein the amplified signal output by the output coil of the output transformer is output after passing through the output matching circuit.

Furthermore, the output matching circuit includes an output filter circuit and a switch group, and the amplified signal output by the output coil of the output transformer is filtered by the output filter circuit, then loaded on the switch group and output via the switch group.

Furthermore, the dual-mode power amplifier with switchable working power further includes a selection circuit mainly composed of a selection switch S and a capacitor C, and the selection circuit is connected in series between taps at both ends of the input coil of the output transformer. Through the selection circuit, certain two groups of taps in the input coil of the output transformer can be selected to conduct according to specific conditions, so as to form high-power conduction, low-power disconnection, or high-power disconnection and low-power conduction.

Beneficial effects: the power amplifier provided by the invention adopts multi-tap input transformer, and realizes the switching between the preload line and output load line by controlling the on/off of the intermediate switch connected with the taps, so that the power amplifier constitutes different working states to achieve the best performance under different maximum output powers.

A change-over switch is used to control the capacitance value of the matching capacitor and adjust the load line of the output stage, thus further ensuring the performance of the power amplifier provided by the invention.

The intermediate switch and change-over switch are integrated on an independent chip by the process of CMOS/phemt/bihemt/SeGe/SOI, etc., or on a power amplifier chip by the process of CMOS/phemt/bihemt/SeGe/SOI, etc, which is easy to realize.

DETAILED DESCRIPTION OF THE INVENTION

The technical solution claimed in the present application will be further described in detail with reference to the drawings and specific embodiments.

Figure 1:
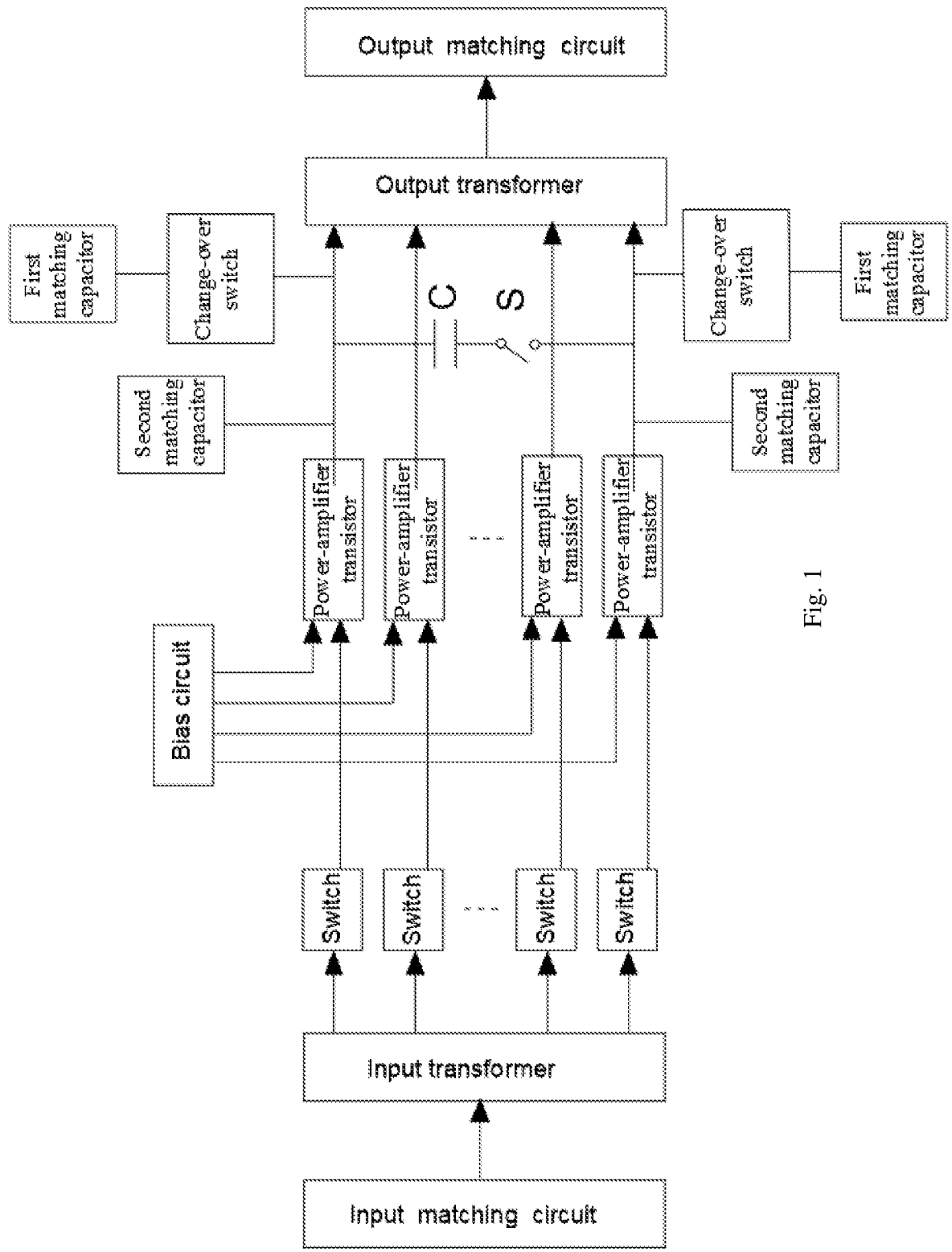
FIG. 1 is a functional block diagram of the power amplifier provided by the present invention.

The technical solution claimed by the present application is a dual-mode power amplifier with switchable working power and a mode switch method based on the power amplifier, wherein the functional block diagram of the dual-mode power amplifier with switchable working power is shown in FIG. 1, which includes:

an input transformer T1, including a plurality of output taps, and an input coil is loaded with a to-be-amplified signal;

an output transformer T2, including a plurality of input taps, the number of the input taps is matched with that of the output taps of the input transformer, and an output coil amplified signals;

an intermediate switch and a power-amplifier transistor, the plurality of output taps of the input transformer are connected with the input taps of the output transformer through the intermediate switch and the power-amplifier transistor, the intermediate switch is configured with a control signal to conduct the power-amplifier transistor connected in series with the intermediate switch, so that one or more of the output taps of the input transformer are communicated with the input taps of the output transformer, and an amplified signal is output after being transformed by the output transformer; and a first matching capacitor and a second matching capacitor, the first matching capacitor and the second matching capacitor are connected in parallel between taps at both ends of the input coil of the output transformer and ground.

Figure 2:
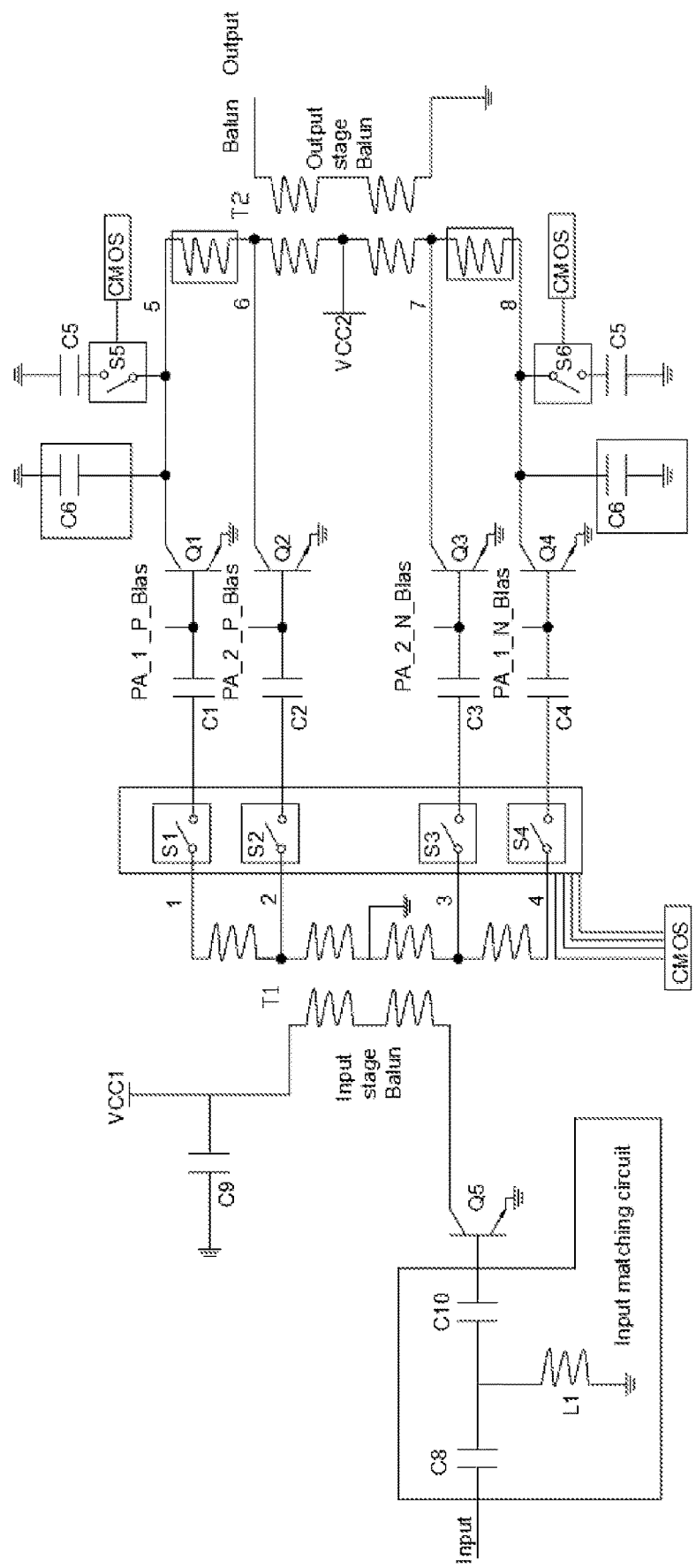
FIG. 2 is a schematic circuit diagram of the power amplifier provided by the present invention.

The number of output taps of the input transform, and the number of input taps of the output transformer in the power amplifier can be 2, 4, 6 or other. The described power amplifier can be either a field effect transistor or a triode transistor. Here, the power amplifier disclosed by the present invention is further introduced by taking the example that the input and output transformers are configured with 4 taps and the power-amplifier transistor is a field effect transistor, as shown in FIG. 2. The output coil of the input transformer T1 includes tap 1, tap 2, tap 3 and tap 4, and the input coil of the matched output transformer T2 includes tap 5, tap 6, tap 7 and tap 8. Tap 1 is connected to the base of power amplifier Q1 via intermediate switch S1 and capacitor C1. The collector of power amplifier Q1 is connected to tap 5, and the emitter is grounded. Tap 2 is connected to the base of power amplifier Q2 via intermediate switch S2 and capacitor C2. The collector of power amplifier Q2 is connected to tap 6, and the emitter is grounded. Tap 3 is connected to the base of power amplifier Q3 via intermediate switch S3 and capacitor C3. The collector of power amplifier Q3 is connected to tap 7, and the emitter is grounded. Tap 4 is connected to the base of power amplifier Q4 via intermediate switch S4 and capacitor C4. The collector of power amplifier Q4 is connected to tap 8 and the emitter is grounded. Tap 5 and tap 8 are grounded via a first matching capacitor C5 and a second matching capacitor C6, respectively, which constitute a parallel connection.

One end of the input coil of input transformer T1 is connected to the power supply VCC1 and grounded via capacitor C9, and the other end is loaded with the signal to be amplified. The conduction of intermediate switches S1-S4 is controlled by external control signals. One end of the output coil of output transformer T2 is grounded, and the other end outputs an amplified signal.

The working state of the power amplifier provided by the invention is categorized as Class E power amplifier working state and Class $F^{-1}$ power amplifier working state. The input coil of input transformer T1 is loaded with a signal to be amplified, and a control signal is loaded on intermediate switches S1-S4 to make intermediate switches S1 and S4 conduct or intermediate switches S2 and S3 conduct. When intermediate switches S1 and S4 are turned on, power amplifier Q1 and Q4 are turned on, and the signal to be amplified is loaded on taps 5 and 8 of the input coil of output transformer T2. The load line consists of first matching capacitor C5 and output transformer T2, in this state, the power amplifier is in Class E power amplifier working state.

When intermediate switches S2 and S3 are turned on by the loaded control signal, power amplifiers Q2 and Q3 are turned on, and the signal to be amplified is loaded on taps 6 and 7 of the input coil of output transformer T2. The load line forms a 3rd order harmonic impedance by second matching capacitor C6 shown in the solid lined box of FIG. 2, the inductance between taps 5 and 6 shown in the solid lined box of FIG. 2, and the inductance between taps 7 and 8 shown in the solid lined box of FIG. 2. In this state, the power amplifier is in Class $F^{-1}$ power amplifier working state.

In order to better adjust the load line of the power amplifier, a change-over switch S5 and a change-over switch S6 are added on the basis of the above solution. Change-over switch S5 is connected in series between tap 1 and first matching capacitor C5, and change-over switch S6 is connected in series between tap 8 and first matching capacitor C5. The conduction of change-over switch S5 and change-over switch S6 is controlled by an external control signal, and the capacitance value of the matching capacitor can be controlled by the change-over switch.

In addition, the dual-mode power amplifier provided by the invention further includes a selection circuit mainly composed of a selection switch S and a capacitor C, and the selection circuit is connected in series between taps at both ends of the input coil of the output transformer.

Figure 3:
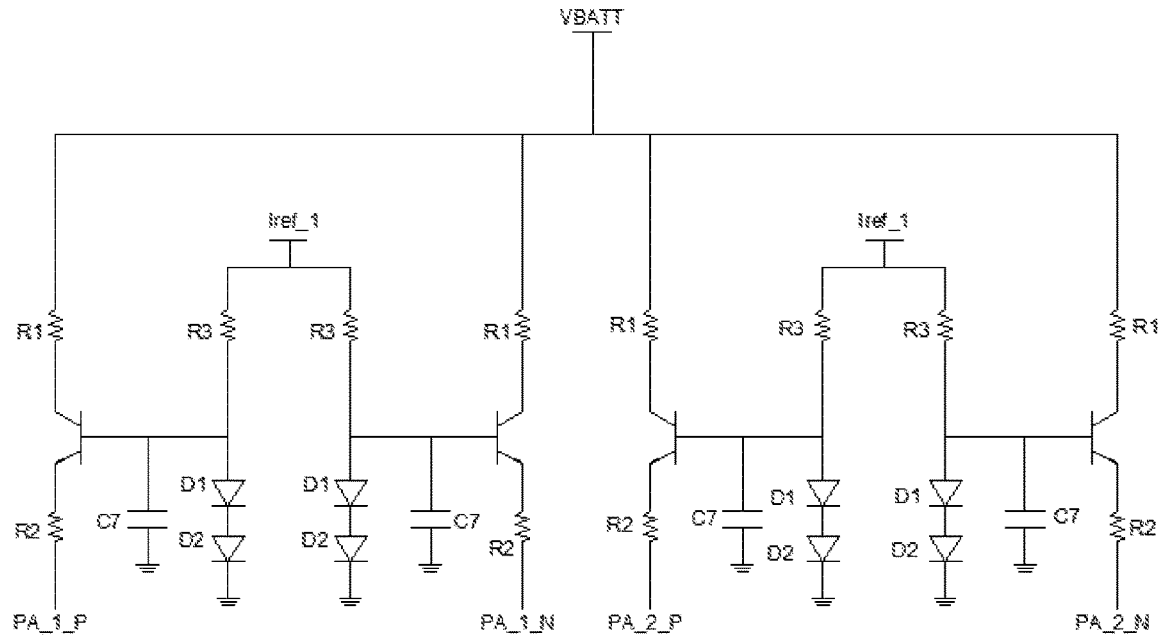
FIG. 3 is a schematic circuit diagram of the bias circuit described in the present invention.

In order to make the power amplifier amplify the signal voltage without distortion, the power amplifier provided by the present invention also includes a bias circuit, the schematic diagram of the bias circuit is shown in FIG. 3, which includes bias branches with the same number as the power amplifier, each bias branch includes an output end, and the output control signal is loaded on the control end of the power amplifier. Each bias branch includes a switch transistor T1, a resistor R1, a resistor R2, a resistor R3, a capacitor C7, a diode D1 and a diode D2. The power supply end of the switch transistor T1 is connected with an external control signal (such as a power supply) via resistor R1, and resistor R2 is connected with the output end of switch transistor T1. The control end of switch transistor T1 is grounded via capacitor C7, switch transistor T1 is also connected to the anode of diode D1, the cathode of diode D1 is connected to the anode of diode D2, and the cathode of diode D2 is grounded. The control end of switch transistor T1 is also connected with an external control signal via resistor R3. Switch transistor T1 may be a triode transistor or a field effect transistor.

In order to ensure the stability of the signal loaded on input transformer T1, the power amplifier further includes an input matching circuit for filtering the to-be-amplified signal and a preamplifier Q5. The input matching circuit includes an input filter circuit, and the input filter circuit can be any of the existing capacitance filter circuit, inductance filter circuit, RC filter circuit or LC filter circuit. The input filter circuit used here includes a capacitor C8, a capacitor C10 and an inductor L1. The first plate of capacitor C8 is used as an input end for loading signals, and the second plate of capacitor C8 is connected to the control end of preamplifier Q5 via capacitor C10. The second plate of capacitor C8 is further grounded via inductor L1, and the power supply end of preamplifier Q5 is grounded, the output end is connected to the input coil of input transformer T1. The preamplifier Q5 may be a triode transistor or a field effect transistor.

To obtain the bandwidth and harmonic suppression required by the power amplifier, the power amplifier further includes an output matching circuit for filtering the signal output by output transformer T2, which includes an output filter circuit and a switch group composed of several switches. The output filter circuit may consist of a capacitor and an inductor, and any one of the following may be obtained.

Figure 4:
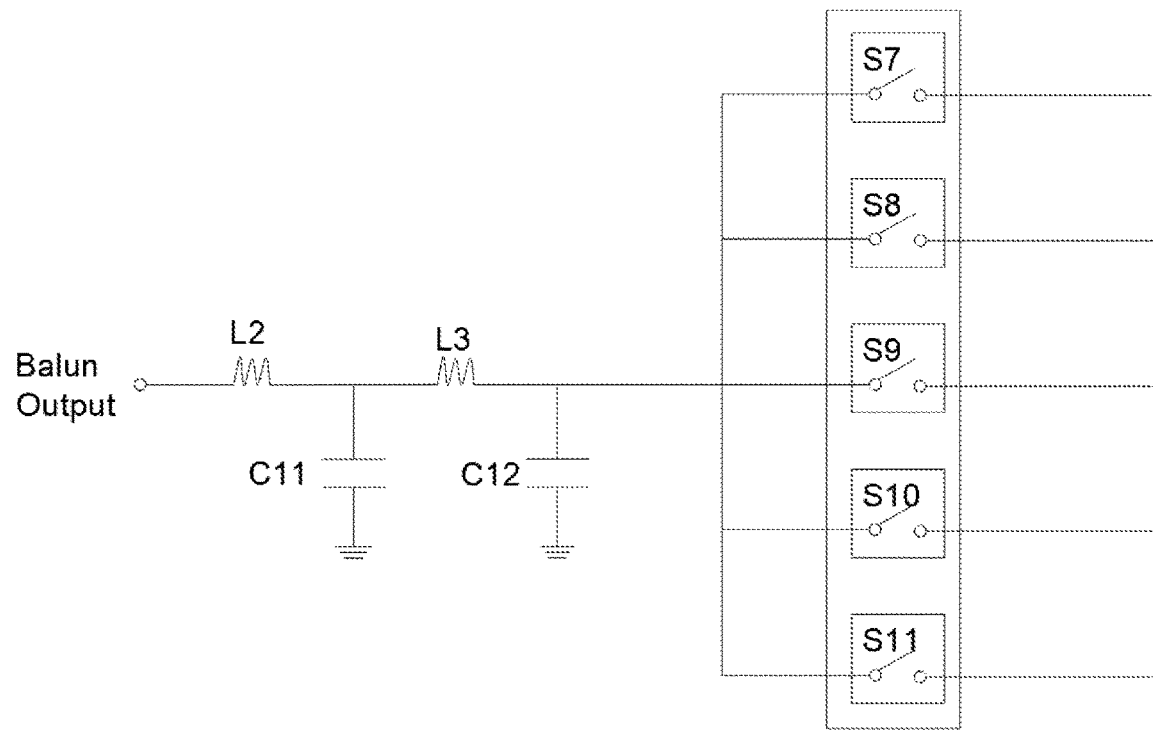
FIG. 4 is a schematic circuit diagram of the output matching circuit described in the present invention.

1. A low-pass filter circuit, its circuit connection is shown in FIG. 4. It includes a capacitor C11, a capacitor C12, an inductor L2 and an inductor L3. One end of inductor L2 is an input end connected to the output coil of output transformer T2, and the other end is connected to the switch group via inductor L3. The end of inductor L2 connected to inductor L3 is grounded via capacitor C11, and the end of inductor L3 connected to the switch group is grounded via capacitor C12.

Figure 5:
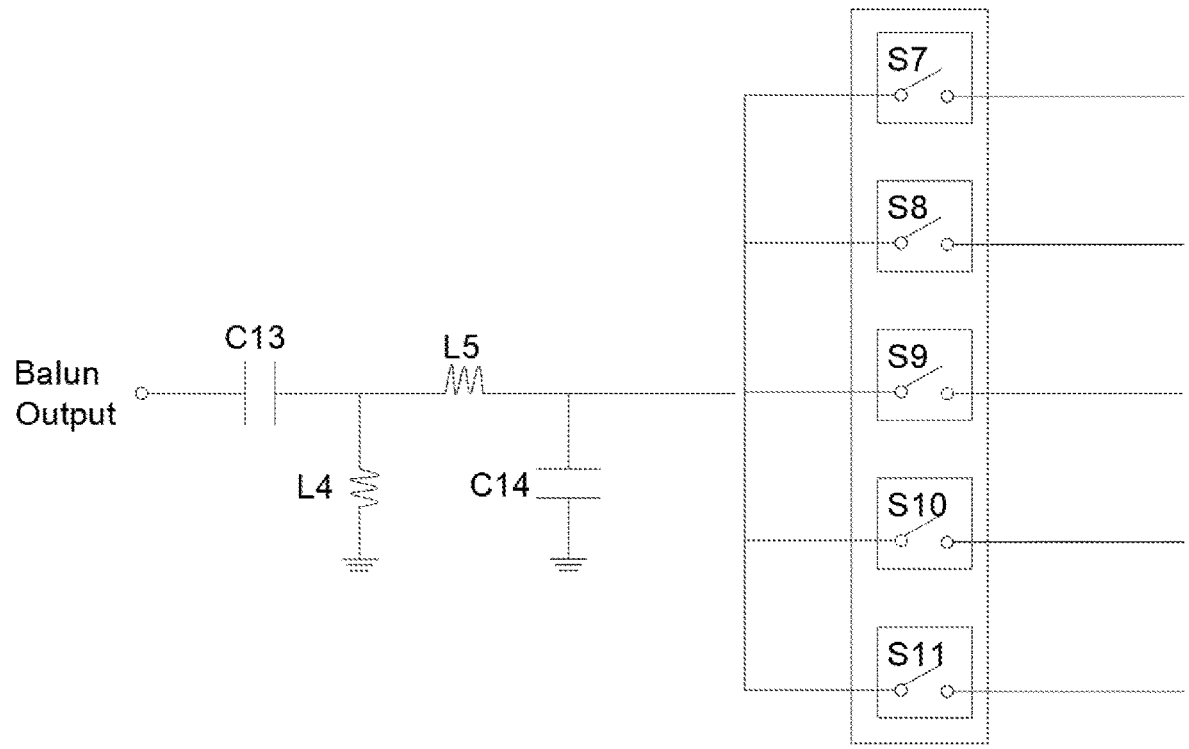
FIG. 5 is an another schematic circuit diagram of the output matching circuit described in the present invention.

2. A high-pass & low-pass circuit, its circuit connection is shown in FIG. 5. It includes a capacitor C13, an inductor L4, an inductor L5 and a capacitor C14. The first plate of capacitor C13 is an input end connected to the output coil of output transformer T2, and the second plate is connected to the switch group via inductor L5. The second plate of capacitor C13 is grounded via inductor L4, and the end of inductor L5 connected with the switch group is grounded via capacitor C14.

Figure 6:
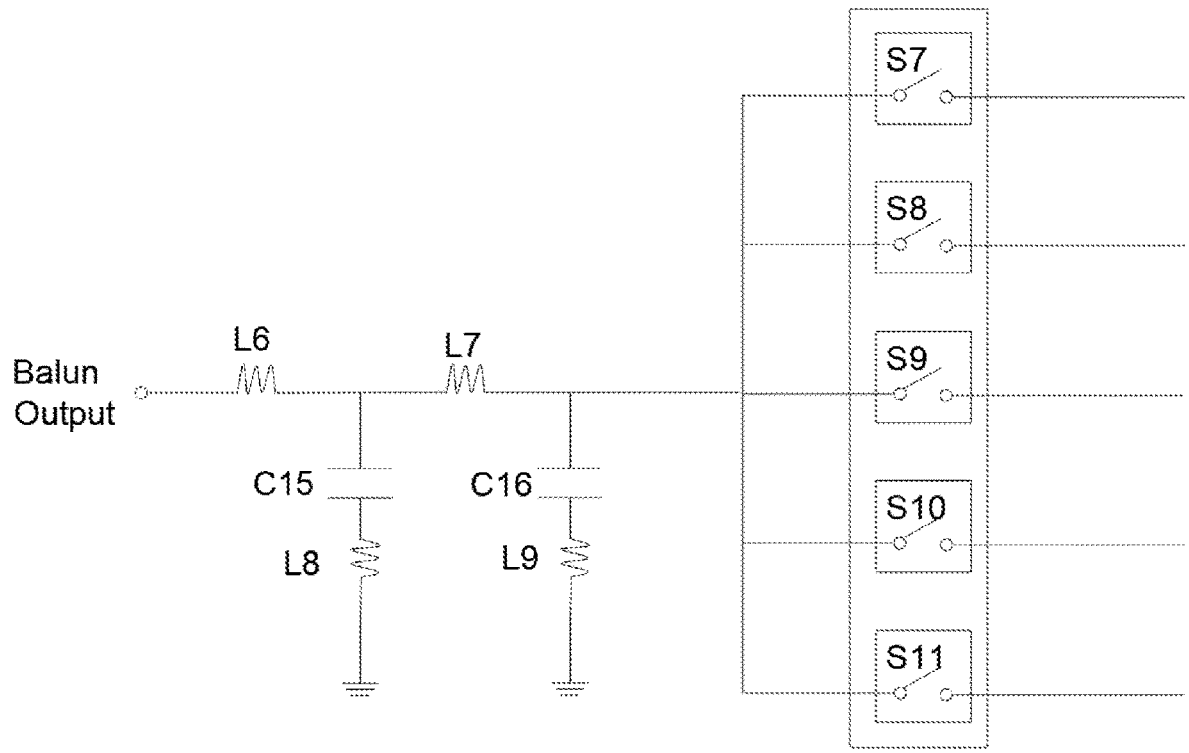
FIG. 6 is an another schematic circuit diagram of the output matching circuit described in the present invention.

3. A low-pass trap circuit, its circuit connection is shown in FIG. 6. It includes a capacitor C15, a capacitor C16, an inductor L6, inductor L7, inductor L8 and inductor L9. One end of inductor L6 is an input end connected to the output coil of output transformer T2, and the other end is connected to the switch group via inductor L7. The end of inductor L6 connected to inductor L7 is grounded via capacitor C15 and inductor L8, and the end of inductor L7 connected to the switch group is grounded via capacitor C16 and inductor L9.

Figure 7:
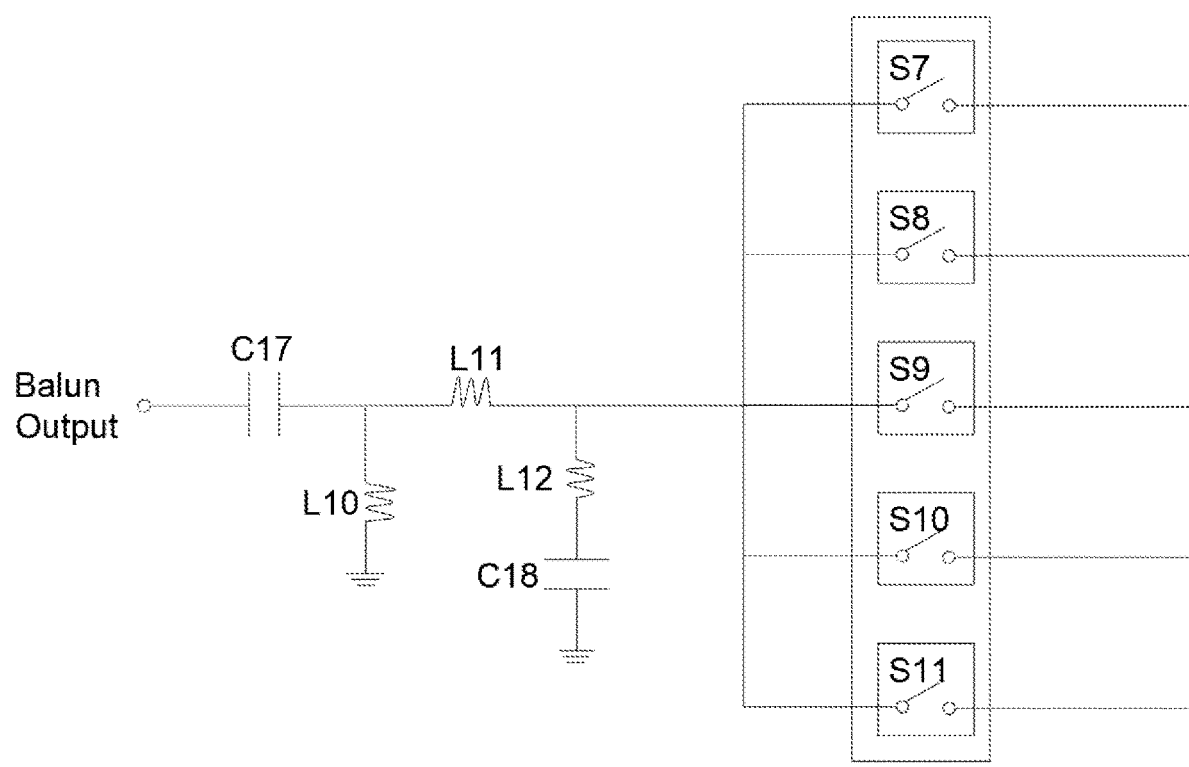
FIG. 7 is an another schematic circuit diagram of the output matching circuit described in the present invention.

4. A high-pass & low-pass trap circuit, its circuit connection is shown in FIG. 7, it includes an inductor L10, inductor L11, inductor L12, a capacitor C17 and a capacitor C18. One end of capacitor C17 is an input end connected to the output coil of output transformer T2, and the other end is connected to the switch group via inductor L11. The end of capacitor C17 connected to inductor L11 is grounded via inductor L10, and the end of inductor L11 connected to the switch group is grounded via inductor L12 and capacitor C18.

The switch groups described in the above four types of filter circuits may consist of 4, 6, 8 or other numbers of switches. In the present application, the switches S7-S11 are used, and each switch is used as one output, and its on-off is controlled by an external control signal. The switches of the switch group may be integrated on a single chip, and the process technology can be selected from SOI/CMOS/PHEMT/BIHEMT/SeGe, etc.

Figure 8:
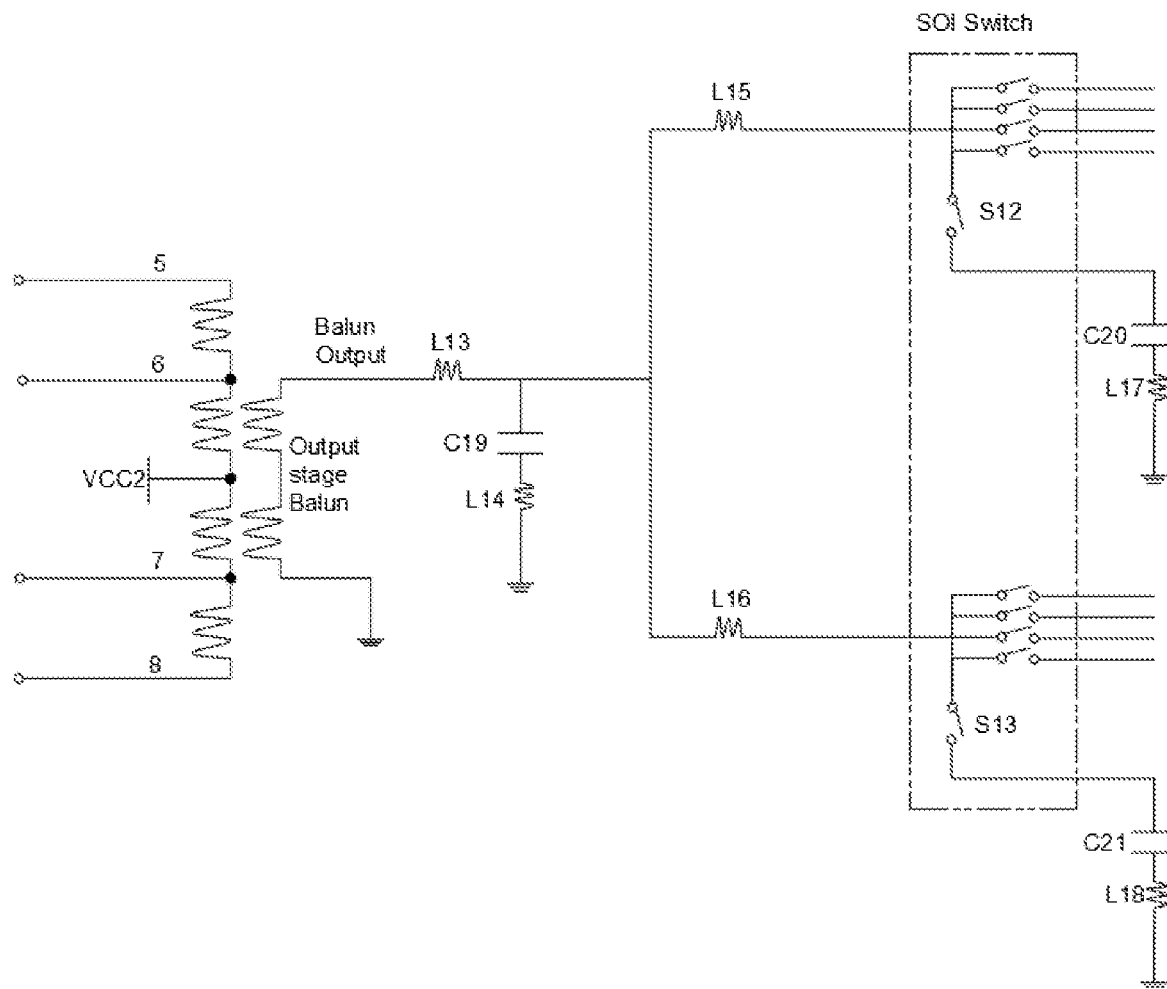
FIG. 8 is an another schematic circuit diagram of the output matching circuit described in the present invention.

In addition to the above structures, the output matching circuit described in the present application can be one of the following structures:

A. As shown in FIG. 8, the output matching circuit includes an inductor L13, inductor L14, inductor L15, inductor L16, inductor L17, inductor L18, a capacitor C19, capacitor C20, capacitor C21, a switch group A, switch group B, an independent switch S12 and independent switch S13. One end of inductor L13 is an input end connected to the output coil of output transformer T2, and the other end is connected to switch group A and switch group B via inductor L15 and inductor L16 respectively. The end of inductor L13 connected to inductor L15 and inductor L16 is further grounded via capacitor C19 and inductor L14. Switch group A is further grounded via independent switch S12, capacitor C20 and inductor L17, and switch group B is further grounded via independent switch S13, capacitor C21 and inductor L18. Switch group A and Switch group B consist of several switches controlled by external control signals, each switch serves as one output, and independent switch S12 and independent switch S13 are controlled by external control signals.

Figure 9:
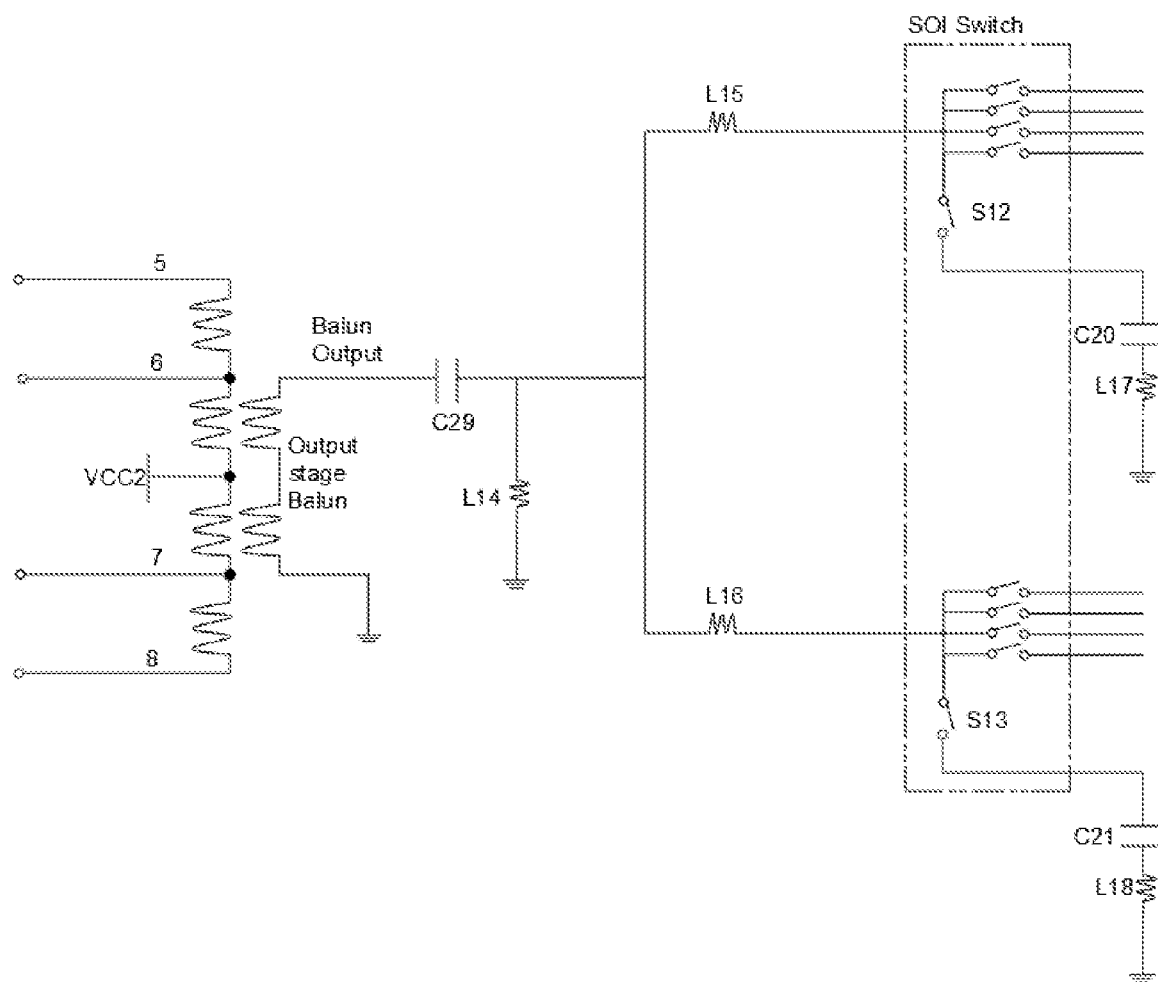
FIG. 9 is an another schematic circuit diagram of the output matching circuit described in the present invention.

B. As shown in FIG. 9, the output matching circuit includes a capacitor C29, an inductor L14, inductor L15, inductor L16, inductor L17, inductor L18, a capacitor C20, capacitor C21, a switch group A, switch group B, an independent switch S12 and independent switch S13. The first plate of capacitor C29 is an input end connected to the output coil of output transformer T2, and the second plate is connected to switch group A and switch group B via inductor L15 and inductor L16 respectively. The second plate of capacitor C29 is further grounded via inductor L14. Switch group A is further grounded via independent switch S12, capacitor C20 and inductor L17, and switch group B is further grounded via independent switch S13, capacitor C21 and inductor L18. Switch group A and Switch group B consist of several switches controlled by external control signals, each switch serves as one output, and independent switch S12 and independent switch S13 are controlled by external control signals.

Figure 10:
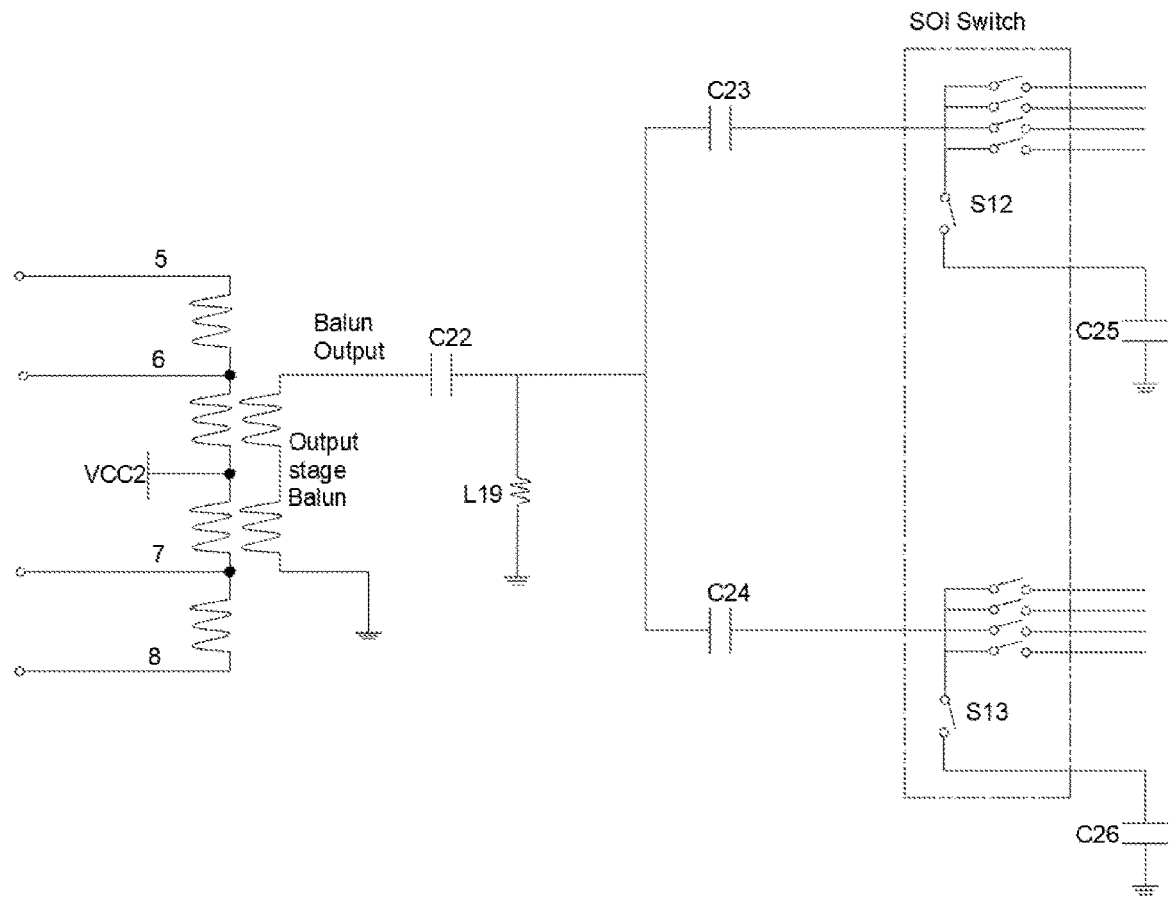
FIG. 10 is an another schematic circuit diagram of the output matching circuit described in the present invention.

C. As shown in FIG. 10, it includes capacitors C22-C26, inductor L19, switch group A, switch group B, independent switch S12 and independent switch S13. The first plate of capacitor C12 is an input end connected to the output coil of output transformer T2, and the other end is connected to switch group A and switch group B via capacitor C23 and capacitor C24 respectively. The end of the capacitor C22 connected to capacitor C23 and capacitor C24 is further grounded via inductor L19. Switch group A is further grounded via independent switch S12 and capacitor C25, and switch group B is further grounded via independent switch S13 and capacitor C26. Switch group A and Switch group B consist of several switches controlled by external control signals, each switch serves as one output, and independent switch S12 and independent switch S13 are controlled by external control signals.

Figure 11:
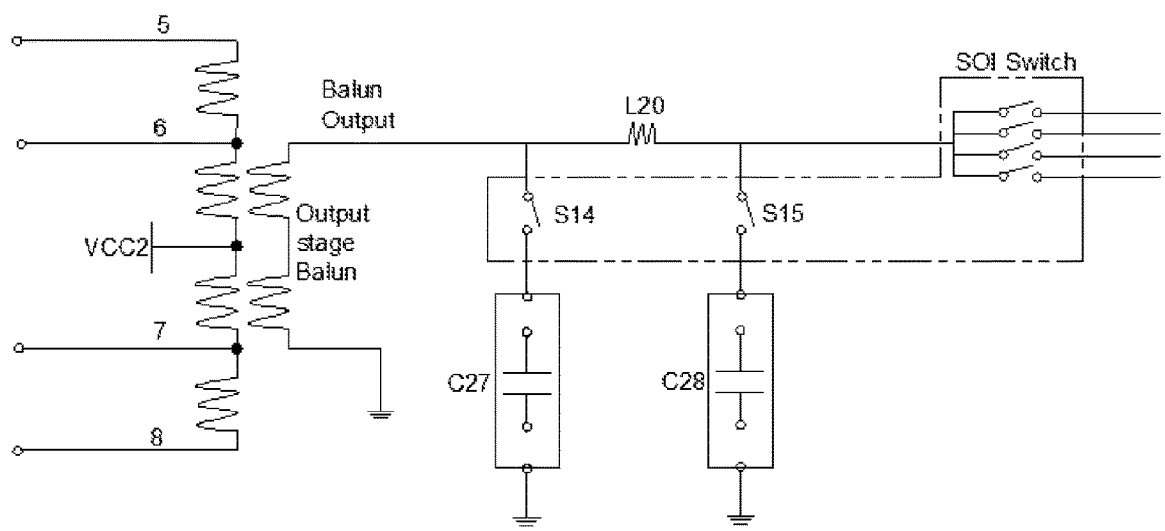
FIG. 11 is an another schematic circuit diagram of the output matching circuit described in the present invention.

D. As shown in FIG. 11, it includes capacitor C27, capacitor C28, inductor L20, switch group C, independent switch S14 and independent switch S15. The output end of output transformer T2 is grounded via independent switch S14 and capacitor C27, also, the output end of output transformer T2 is connected to switch group C via inductor L20, and the end of inductor L20 connected to switch group C is further grounded via independent switch S15 and capacitor C28. The switch group C consists of several switches controlled by external control signals, and each switch serves as one output. Those switches, independent switch S14 and independent switch S15 constituting switch group C may be independently arranged, or integrated on an independent SOI chip. Capacitor C27 and capacitor C28 constitute a trap circuit, and besides capacitor C27 and capacitor C28 described in the present application, any types of the existing trap circuit may be used. For example, capacitor C27 and capacitor C28 may be replaced with inductors, or inductors are connected in series on the branches of capacitor C27 and capacitor C28 respectively, to form a series circuit of capacitor+inductor.

Those switches, independent switch S12 and independent switch S13, which constitute switch group A and switch group B, described in A, B and C above, can be arranged independently, or integrated on an independent SOI chip.

The intermediate switches and change-over switches described in the present application can be arranged independently, or they can be integrated on an independent SOI chip as a group of two or more switches or all switches. For example, intermediate switch S1 and intermediate switch S4 are a group, switch S2 and intermediate switch S3 are a group, change-over switch S5 and change-over switch S6 are a group, or intermediate switches S1-S4 are a group, or intermediate switches S1-S4, change-over switch S5 and change-over switch S6 are a group, or others.

The dual-mode power amplifier provided by the invention may adopt a distributed circuit structure, or all components can be integrated on a chip by the process of bihemt/SOI/phemt/CMOS/SeGe to form an integrated circuit. It is also possible to integrate some components on one chip, the other components on another chip, and connect the chips via signal lines. For example, two or more than two or all of the intermediate switches may be integrated as a group on an independent SOI chip. Two or more than two or all of the change-over switches may be integrated as a group on an independent SOI chip. The output matching circuit, input matching circuit, preamplifier, input transformer and output transformer may be integrated on an independent SOI chip, and each independent SOI chip is connected via a signal line.

In the present application, input transformer T1 and output transformer T2 may be any types of the existing transformer. A balanced-unbalanced transformer (Balun) is used in the present application.

The above embodiments are only used to illustrate the technical solution of the present application, not intended to limit it. Modifications or equivalent substitutions made by those skilled in the art, which do not deviate from the spirit or scope of the present application, shall be included in the protection scope of the claims.

What is claimed is:

1. A dual-mode power amplifier with switchable working power, comprising
   an input transformer, comprising a plurality of output taps, and an input coil is loaded with a to-be-amplified signal;
   an output transformer, comprising a plurality of input taps, the number of the input taps is matched with that of the output taps of the input transformer, and an output coil amplified signals;
   wherein each output tap of the input transformer is connected to a corresponding input tap of the output transformer via an intermediate switch and a power-amplifier transistor; the intermediate switch is configured with a control signal to conduct the power-amplifier transistor connected in series with the intermediate switch, so that one or more of the output taps of the input transformer are communicated with the input taps of the output transformer, and an amplified signal is output after being transformed by the output transformer; and
   wherein each input tap at both ends of the input coil of the output transformer is connected to ground via parallel-connected first and second matching capacitors.

2. The dual-mode power amplifier with switchable working power of claim 1, wherein a change-over switch is connected between taps at both ends of the input coil of the output transformer and the first matching capacitor.

3. The dual-mode power amplifier with switchable working power of claim 2, wherein two or more of the intermediate switches and the change-over switches are a group and integrated on a single SOI chip.

4. The dual-mode power amplifier with switchable working power of claim 1, wherein two or more of the intermediate switches are a group and integrated on a single SOI chip.

5. The dual-mode power amplifier with switchable working power of claim 1, further comprising an input matching circuit and a preamplifier, wherein the to-be-amplified signal loaded on the input coil of the input transformer is matched by the input matching circuit and amplified by the preamplifier and then loaded.

6. The dual-mode power amplifier with switchable operating power of claim 5, wherein the input matching circuit comprises an input filter circuit.

7. The dual-mode power amplifier with switchable working power of claim 1, further comprising an output matching circuit, wherein the amplified signal output by the output coil of the output transformer is output after passing through the output matching circuit.

8. The dual-mode power amplifier with switchable working power of claim 7, wherein the output matching circuit comprises an output filter circuit and a switch group, and the amplified signal output by the output coil of the output transformer is filtered by the output filter circuit, then loaded on the switch group and output via the switch group.

9. The dual-mode power amplifier with switchable working power of claim 1, further comprising a selection circuit mainly composed of a selection switch S and a capacitor C, and the selection circuit is connected in series between taps at both ends of the input coil of the output transformer.

10. A mode switch method of the dual-mode power amplifier with switchable working power of claim 1, wherein the to-be-amplified signal is loaded on the input coil of the input transformer, and a control signal is loaded on the intermediate switches to turn on part of the intermediate switches, and the power-amplifier transistor connected in series with the turned-on intermediate switch is turned on so that one or more of the plurality of output taps of the input transformer is/are communicated with the input taps of the output transformer, and an amplified signal is output after being transformed by the output transformer.

* * * * *